United States Patent
Saito et al.

(10) Patent No.: US 10,355,089 B2
(45) Date of Patent: Jul. 16, 2019

(54) SEMICONDUCTOR DEVICE AND SEMICONDUCTOR DEVICE MANUFACTURING METHOD

(71) Applicant: FUJI ELECTRIC CO., LTD., Kawasaki-shi (JP)

(72) Inventors: Takashi Saito, Matsumoto (JP); Masaaki Ogino, Matsumoto (JP); Eiji Mochizuki, Matsumoto (JP); Yoshikazu Takahashi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/841,570

(22) Filed: Aug. 31, 2015

(65) Prior Publication Data

US 2015/0372095 A1 Dec. 24, 2015

Related U.S. Application Data

(63) Continuation of application No. PCT/JP2014/057208, filed on Mar. 17, 2014.

(30) Foreign Application Priority Data

Mar. 29, 2013 (JP) ................. 2013-075148

(51) Int. Cl.
*H01L 21/04* (2006.01)
*H01L 29/08* (2006.01)
(Continued)

(52) U.S. Cl.
CPC ........ *H01L 29/1608* (2013.01); *H01L 21/045* (2013.01); *H01L 21/049* (2013.01);
(Continued)

(58) Field of Classification Search
CPC . H01L 21/045; H01L 21/0485; H01L 21/049; H01L 21/28568; H01L 21/324;
(Continued)

(56) References Cited

U.S. PATENT DOCUMENTS 6,046,105 A * 4/2000 Kittl ................. H01L 21/28052
257/E21.165
7,297,413 B2 11/2007 Mitsumori
(Continued)

FOREIGN PATENT DOCUMENTS

CN 1763245 A 4/2006
JP H06-349828 A 12/1994
(Continued)

*Primary Examiner* — Allen L Parker
*Assistant Examiner* — Charles N Ausar-El
(74) *Attorney, Agent, or Firm* — Rabin & Berdo, P.C.

(57) ABSTRACT

A MOS gate structure including a p base region, a p epitaxial layer, an $n^{++}$ source region, a $p^+$ contact region, an n inversion region, a gate insulating film, and a gate electrode and a front surface electrode are provided on the front surface of an epitaxial substrate obtained by depositing an $n^-$ epitaxial layer on the front surface of a SiC substrate. A first metal film is provided on the front surface electrode so as to cover 10% or more, preferably, 60% to 90%, of an entire upper surface of the front surface electrode. The SiC-MOSFET is manufactured by forming a rear surface electrode, forming the first metal film on the surface of the front surface electrode, and annealing in a $N_2$ atmosphere. According to this structure, it is possible to suppress a reduction in gate threshold voltage in a semiconductor device using a SiC semiconductor.

12 Claims, 16 Drawing Sheets

(51) Int. Cl.
  *H01L 29/10* (2006.01)
  *H01L 29/16* (2006.01)
  *H01L 29/40* (2006.01)
  *H01L 29/45* (2006.01)
  *H01L 29/66* (2006.01)
  *H01L 29/78* (2006.01)
  *H01L 21/285* (2006.01)
  *H01L 21/324* (2006.01)
  *H01L 29/739* (2006.01)

(52) U.S. Cl.
  CPC .... *H01L 21/0485* (2013.01); *H01L 21/28568* (2013.01); *H01L 21/324* (2013.01); *H01L 29/0878* (2013.01); *H01L 29/401* (2013.01); *H01L 29/45* (2013.01); *H01L 29/66068* (2013.01); *H01L 29/7395* (2013.01); *H01L 29/7802* (2013.01); *H01L 29/1095* (2013.01)

(58) Field of Classification Search
  CPC ........... H01L 29/66068; H01L 27/3262; H01L 27/3248; H01L 29/1608; H01L 29/12; H01L 29/45; H01L 29/7395; H01L 29/78; H01L 29/7802; H01L 29/401; H01L 29/0878
  See application file for complete search history.

(56) References Cited

U.S. PATENT DOCUMENTS

| | | | |
|---|---|---|---|
| 7,678,680 B2 | 3/2010 | Fuchs et al. | |
| 7,829,416 B2* | 11/2010 | Kudou | H01L 29/78 438/268 |
| 8,035,112 B1* | 10/2011 | Cooper | H01L 23/544 257/76 |
| 8,791,525 B2* | 7/2014 | Montgomery | H01L 24/02 257/330 |
| 9,041,007 B2* | 5/2015 | Suekawa | H01L 29/45 257/288 |
| 9,129,939 B2* | 9/2015 | Imai | H01L 29/45 |
| 9,257,283 B2* | 2/2016 | Michael | H01L 21/0485 |
| 9,401,411 B2* | 7/2016 | Imai | H01L 29/45 |
| 9,842,906 B2 | 12/2017 | Suekawa et al. | |
| 9,923,062 B2* | 3/2018 | Utsumi | H01L 21/324 |
| 9,947,761 B2* | 4/2018 | Kobayashi | H01L 29/66333 |
| 2004/0227239 A1* | 11/2004 | Murata | H01L 23/498 257/738 |
| 2006/0088705 A1 | 4/2006 | Mitsumori | |
| 2006/0273323 A1* | 12/2006 | Yamamoto | H01L 21/0485 257/77 |
| 2008/0102585 A1* | 5/2008 | Nakamura | H01L 21/049 438/285 |
| 2008/0102591 A1* | 5/2008 | Nakamura | H01L 21/049 438/308 |
| 2008/0224150 A1* | 9/2008 | Suzuki | H01L 21/0465 257/77 |
| 2010/0193799 A1* | 8/2010 | Nakano | H01L 29/1608 257/77 |
| 2010/0197127 A1 | 8/2010 | Urano | |
| 2010/0207125 A1* | 8/2010 | Uchida | H01L 21/0485 257/77 |
| 2010/0240213 A1 | 9/2010 | Urano et al. | |
| 2010/0295062 A1* | 11/2010 | Uchida | H01L 29/0696 257/77 |
| 2011/0079791 A1* | 4/2011 | Chandrashekhar | G21H 1/02 257/77 |
| 2012/0068258 A1 | 3/2012 | Ono et al. | |
| 2012/0132912 A1* | 5/2012 | Suekawa | H01L 29/45 257/49 |
| 2013/0026559 A1* | 1/2013 | Arthur | H01L 29/66068 257/329 |
| 2013/0075756 A1* | 3/2013 | Arthur | H01L 21/045 257/77 |
| 2013/0313570 A1* | 11/2013 | Sdrulla | H01L 29/7806 257/77 |
| 2015/0115285 A1* | 4/2015 | Kinoshita | H01L 29/872 257/77 |
| 2015/0349115 A1* | 12/2015 | Tega | H01L 29/7813 257/77 |
| 2015/0372094 A1* | 12/2015 | Horii | H01L 21/76804 257/77 |
| 2016/0027891 A1* | 1/2016 | Yamada | H01L 29/401 257/77 |

FOREIGN PATENT DOCUMENTS

| | | |
|---|---|---|
| JP | H07-86221 A | 3/1995 |
| JP | 2000-223442 A | 8/2000 |
| JP | 2004-107734 A | 4/2004 |
| JP | 2006-131949 A | 5/2006 |
| JP | 2006-152431 A | 6/2006 |
| JP | 2007-019412 A | 1/2007 |
| JP | 2008-502156 A | 1/2008 |
| JP | 2009-111188 A | 5/2009 |
| JP | 2010-098139 A | 4/2010 |
| JP | 2010-182807 A | 8/2010 |
| JP | 2010-251719 A | 11/2010 |
| JP | 2010-272711 A | 12/2010 |
| JP | 2012-064899 A | 3/2012 |
| JP | 2012-129503 A | 7/2012 |
| JP | 2013-016538 A | 1/2013 |

* cited by examiner

FIG. 5

| ELECTROLESS NiP PLATING PROCESS | | |
|---|---|---|
| PROCESS NAME | TEMPERATURE | PROCESSING TIME |
| CLEANING | 50°C | 5 MINUTES |
| ETCHING | RT | 2.5 MINUTES |
| ACID CLEANING | RT | 40 SECONDS |
| ZINCATE | RT | 40 SECONDS |
| ELECTROLESS NiP PLATING | 80°C | 27 MINUTES |
| IMMERSION Au PLATING | 75°C | 20 MINUTES |

| ELECTROLESS Cu PLATING PROCESS | | |
|---|---|---|
| PROCESS NAME | TEMPERATURE (°C) | PROCESSING TIME |
| CLEANING | 50 | 5 MINUTES |
| ETCHING | 50 | 50 SECONDS |
| ACID CLEANING | 21 | 30 SECONDS |
| FIRST ZINCATE | 21 | 10 SECONDS |
| ACID CLEANING | 21 | 60 SECONDS |
| SECOND ZINCATE | 21 | 45 SECONDS |
| ELECTROLESS Cu PLATING | 60 | 60 MINUTES |

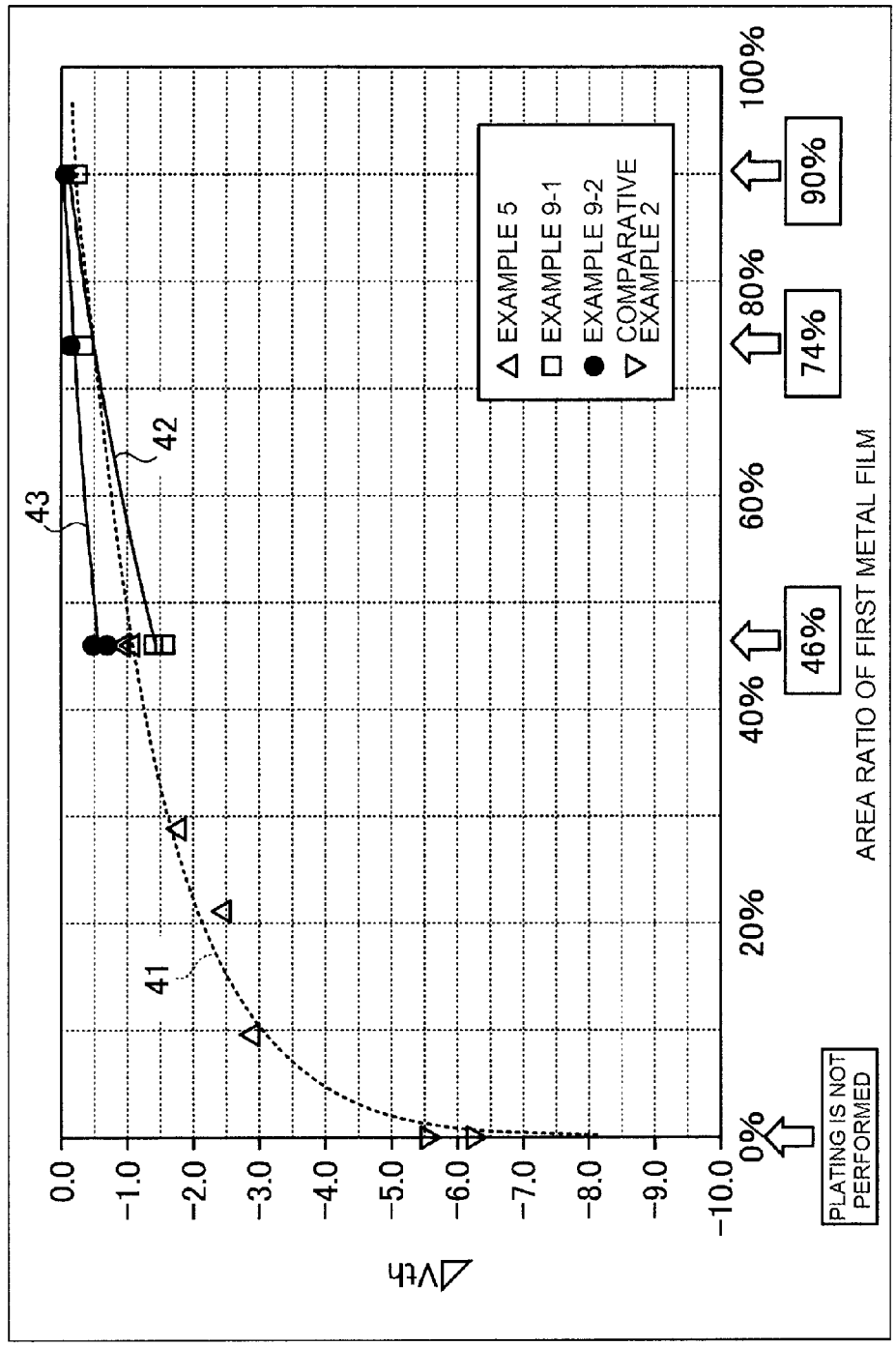

AREA RATIO 20%

AREA RATIO 46%

AREA RATIO 74%

AREA RATIO 90%

FIG. 12

|  |  | N₂ ANNEALING TIME | | | |
|---|---|---|---|---|---|
|  |  | 0.5 HOURS | 1 HOUR | 3 HOURS | 6 HOURS |
| ANNEALING TEMPERATURE (°C) | 280 |  | −2.93V |  |  |
|  | 300 |  | −2.36V |  |  |
|  | 330 | −2.98V | −2.83V | −1.13V |  |
|  | 420 | −4.00V | −1.87V | −3.02V | −5.31V |
|  | 450 |  | −7.42V |  |  |

FIG. 13

|  |  | N₂ ANNEALING TIME | | | |
|---|---|---|---|---|---|
|  |  | 0.5 HOURS | 1 HOUR | 3 HOURS | 6 HOURS |
| ANNEALING TEMPERATURE (°C) | 280 |  | −0.23 | −0.02 |  |
|  | 300 |  |  | −0.03 | −0.05 |
|  | 330 |  |  | −0.03 | −0.10 |

US 10,355,089 B2

SEMICONDUCTOR DEVICE AND SEMICONDUCTOR DEVICE MANUFACTURING METHOD

CROSS-REFERENCE TO RELATED APPLICATION

This is a continuation application of International Application number PCT/JP2014/057208, which was filed on Mar. 17, 2014 and designated the United States. Furthermore, this application claims the benefit of foreign priority of Japanese application number 2013-075148, filed on Mar. 29, 2013. The disclosures of both of these earlier applications are incorporated herein by reference.

BACKGROUND OF THE INVENTION

Technical Field

The present invention relates to a semiconductor device and a semiconductor device manufacturing method.

Background Art

An insulated gate field effect transistor (hereinafter, referred to as a SiC-MOSFET) has been known as a semiconductor device using a silicon carbide (SiC) semiconductor. A representative example of the front surface element structure of the SiC-MOSFET includes a MOS gate (metal-oxide film-semiconductor insulated gate) structure having a silicon dioxide ($SiO_2$) film as a gate insulating film, a phosphosilicate glass (PSG) film as an interlayer insulating film, and an aluminum (Al) electrode as a front surface electrode, which are provided on the front surface side of a SiC substrate.

The structure of the SiC-MOSFET according to the related art will be described with reference to FIG. 16. FIG. 16 is a cross-sectional view illustrating the structure of the SiC-MOSFET according to the related art. As illustrated in FIG. 16, the SiC-MOSFET according to the related art includes a MOS gate structure including a p base region 103, an $n^{++}$ source region 105, a $p^+$ contact region 106, a gate oxide film 108, and a gate electrode 109, an interlayer insulating film 110, and an aluminum-silicon (Al—Si) electrode 113, which are provided on the front surface side of an epitaxial substrate obtained by depositing an $n^-$ epitaxial layer 102 on the front surface of a SiC substrate 101.

The interlayer insulating film 110 has a source contact hole through which the $n^{++}$ source region 105 and the $p^+$ contact region 106 are selectively exposed. The Al—Si electrode 113 is provided so as to cover the front surface of the substrate in an active region and is electrically connected to portions of the $n^{++}$ source region 105 and the $p^+$ contact region 106 which are exposed through the source contact hole of the interlayer insulating film 110. In addition, the Al—Si electrode 113 is electrically insulated from the gate electrode 109 by the interlayer insulating film 110. Reference numeral 104 indicates a p epitaxial layer and reference numeral 107 indicates an n inversion region. Reference numeral 111 indicates a titanium nitride (TiN) film and reference numeral 112 indicates a nickel (Ni) film.

A contact metal film 114 and a rear surface electrode 115 are sequentially formed on the rear surface of the epitaxial substrate, that is, the rear surface of the SiC substrate 101. The SiC-MOSFET is mounted in a package and a bonding wire (not illustrated) made of aluminum is electrically connected to the Al—Si electrode 113, which is the front surface electrode, and an external connection terminal by ultrasonic vibration. A metal film is formed on the surface of a portion of the Al—Si electrode 113 to which the bonding wire is connected. In this way, instead of the Al—Si electrode 113, solder is closely adhered to a lead frame having copper (Cu) as a base material.

As a method for forming the metal film on the surface of the front surface electrode, a method has been proposed which continuously performs a step of bringing the material to be plated into contact with an electroless gold plating solution without gold ions and a step of bringing the material to be plated into contact with an electroless gold plating solution including gold ions (for example, see JP 2000-223442 A). In addition, as another method, a method has been proposed which performs plating on a conductive portion that is formed on the surface of a substrate to sequentially form a Ni film having Ni as a main component and an Au film having gold (Au) as a main component and performs post-processing for removing a Ni compound attached to the surface of the Au film (for example, see JP 2004-107734 A).

As still another method, a plating method has been proposed which forms a first metal film made of Ni—P (phosphorus) on a metal film using a plating process and forms a second metal film having Au as a main component on the first metal film using the plating process (for example, see JP 2006-131949 A). In this plating method, a first Ni plating solution which is used to form the first metal film with a P content of 3 wt % to 6 wt % is produced and a second Ni plating solution which is used to form the first metal film with a P content of 6 wt % to 9 wt % is produced. The first Ni plating solution is used to form the first metal film as a first layer on the surface of the metal film. Then, the second plating solution is used to form the first metal film as a second layer.

SUMMARY OF THE INVENTION

However, in the SiC-MOSFET according to the related art, when the negative voltage is applied to the gate electrode, a gate threshold voltage Vth is significantly less than a desired set value. The case that the negative voltage is applied to the gate electrode is, for example, a case that a gate potential is set to be negative with respect to a source potential in order to reliably turn off the semiconductor device. The inventors conducted a thorough study and found that the gate threshold voltage Vth was about 8 V less than that before the negative voltage was applied (before a bias temperature stress test (hereinafter, referred to as a BT test)) by the BT test in which a bias temperature (hereinafter, referred to as a BT temperature) was 200° C., a voltage of −20 V was applied to the gate electrode, and the processing time was 10 minutes. When the gate threshold voltage Vth is reduced, the SiC-MOSFET does not operate as a general MOSFET. For example, in this case, when the positive voltage is not applied to the gate electrode, the source and the drain are electrically connected to each other (hereinafter, referred to as a normally-on state). Therefore, it is difficult to obtain reliability required for, for example, a general semiconductor device using a silicon (Si) semiconductor.

The invention has been made in view of the above-mentioned problems of the related art and an object of the invention is to provide a semiconductor device using a silicon carbide semiconductor and a semiconductor device manufacturing method which can suppress a reduction in gate threshold voltage.

In order to solve the above-mentioned problems and achieve the object of the invention, a semiconductor device manufacturing method according to the invention has the following characteristics. First, a first step of forming an insulated gate structure including a gate insulating film and a gate electrode on a front surface of a silicon carbide substrate is performed. Then, a second step of forming a front surface electrode which is made of aluminum or an aluminum alloy over the front surface of the silicon carbide substrate so as to be insulated from the gate electrode by an interlayer insulating film is performed. A third step of forming, on a surface of the front surface electrode, a metal film which is made of nickel, a nickel alloy, copper, palladium, titanium, platinum, gold, or silver or a metal laminated film of two or more metal films made of the metal materials is performed. Then, a fourth step of performing annealing in a nitrogen gas atmosphere, a mixed gas atmosphere including nitrogen, a vacuum atmosphere, or an argon gas atmosphere is performed after the third step.

The semiconductor device manufacturing method according to the invention may further include a fifth step of performing annealing in a nitrogen gas atmosphere, a mixed gas atmosphere including nitrogen, a vacuum atmosphere, or an argon gas atmosphere after the second step and before the third step.

In the semiconductor device manufacturing method according to the invention, an annealing temperature in the fifth step may be higher than an annealing temperature in the fourth step.

In the semiconductor device manufacturing method according to the invention, an annealing temperature in the fifth step may be equal to or higher than 350° C.

In the semiconductor device manufacturing method according to the invention, the annealing temperature in the fourth step may be equal to or higher than 150° C. and equal to or lower than 450° C.

In the semiconductor device manufacturing method according to the invention, the annealing temperature in the fourth step may be equal to or higher than 300° C. and equal to or lower than 420° C.

In the semiconductor device manufacturing method according to the invention, in the third step, the metal film or the metal laminated film may be formed so as to cover 60% to 90% of the surface of the front surface electrode.

In order to solve the above-mentioned problems and achieve the object of the invention, a semiconductor device according to the invention has the following characteristics. An insulated gate structure including a gate insulating film and a gate electrode is formed on a front surface of a silicon carbide substrate. A front surface electrode is provided over the front surface of the silicon carbide substrate so as to be insulated from the gate electrode by an interlayer insulating film. The front surface electrode is made of aluminum or an aluminum alloy. A metal film which is made of nickel, a nickel alloy, copper, palladium, titanium, platinum, gold, or silver or a metal laminated film of two or more metal films made of the metal materials is provided on a surface of the front surface electrode so as to cover 60% or more of the surface of the front surface electrode.

In the semiconductor device according the invention, the metal film or the metal laminated film may cover 90% or more of the surface of the front surface electrode.

According to the semiconductor device and the semiconductor device manufacturing method of the invention, the metal film is formed on the surface of the front surface electrode and annealing is performed in, for example, a nitrogen atmosphere. Therefore, it is possible to suppress a reduction in gate threshold voltage when a negative voltage is applied to a gate electrode.

BRIEF DESCRIPTION OF DRAWINGS

FIG. 5 is a table illustrating the conditions of an electroless NiP plating process according to Example 3;

FIG. 7 is a table illustrating the conditions of an electroless Cu plating process according to Example 4;

FIG. 9 is a characteristic diagram illustrating the relationship between the area ratio of a first metal film and a decrease in gate threshold voltage in semiconductor devices according to Examples 5 and 9;

FIG. 12 is a characteristic diagram illustrating the relationship between the annealing temperature and annealing time and a decrease in gate threshold voltage in a semiconductor device according to Example 7-1;

FIG. 13 is a characteristic diagram illustrating the relationship between the annealing temperature and annealing time and a decrease in gate threshold voltage in a semiconductor device according to Example 7-2;

DETAILED DESCRIPTION OF THE INVENTION

Figure 1:
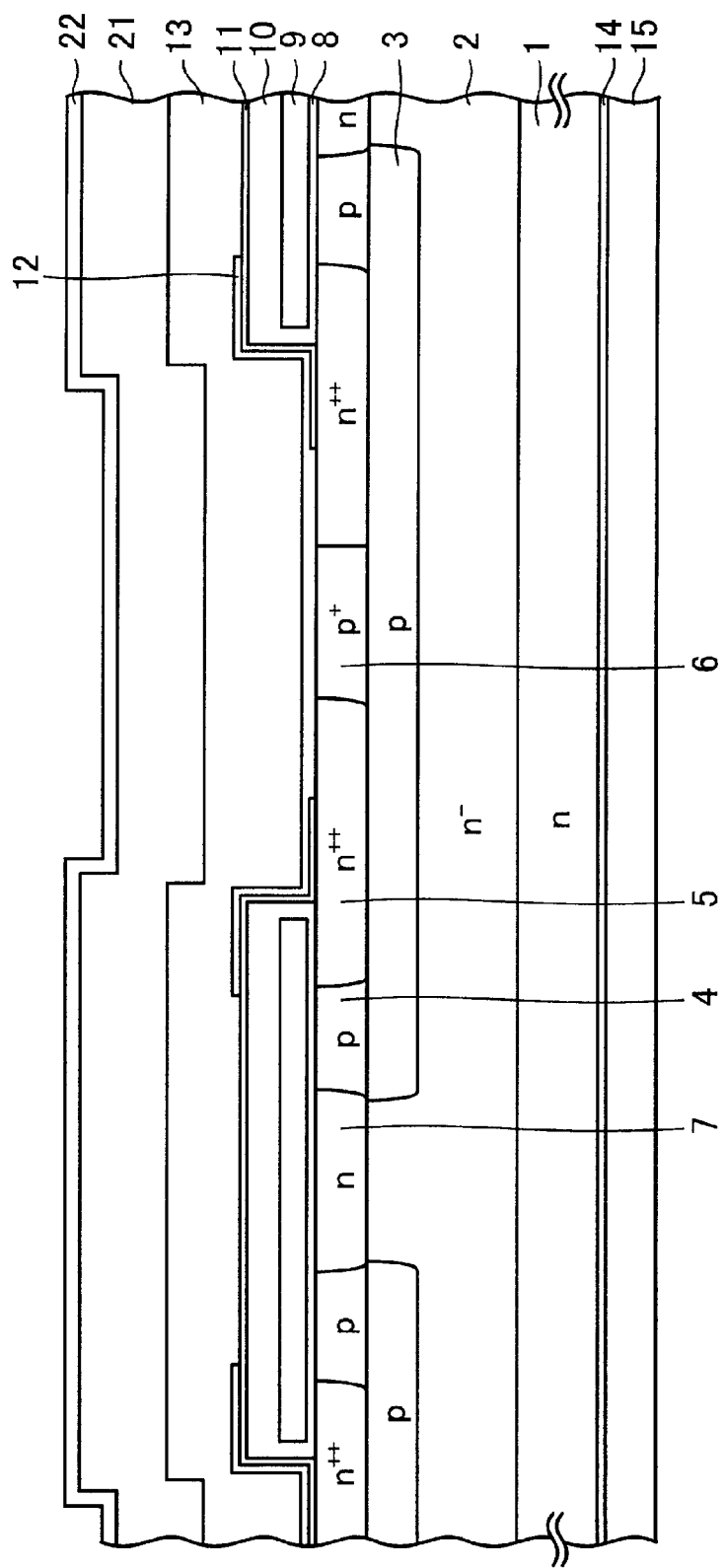
FIG. 1 is a cross-sectional view illustrating the structure of a semiconductor device according to Embodiment 1.

Hereinafter, preferred embodiments of a semiconductor device and a semiconductor device manufacturing method according to the invention will be described in detail with reference to the accompanying drawings. In the specification and the accompanying drawings, in the layers or regions having "n" or "p" appended thereto, an electron or a hole means a majority carrier. In addition, symbols "+" and "−"

added to n or p mean that impurity concentration is higher and lower than that of the layer or region without the symbols. In the description of the following embodiments and the accompanying drawings, the same components are denoted by the same reference numerals and the description thereof will not be repeated.

Embodiment 1

The structure of a semiconductor device according to Embodiment 1 will be described. FIG. 1 is a cross-sectional view illustrating the structure of the semiconductor device according to Embodiment 1. As illustrated in FIG. 1, the semiconductor device according to Embodiment 1 is a SiC-MOSFET that is manufactured (produced) using an epitaxial substrate obtained by depositing an $n^-$ epitaxial layer 2, which will be an $n^-$ drift layer, on the front surface of a SiC substrate 1 which will be an n drain region. A p base region 3 is selectively provided in a surface layer of the epitaxial substrate close to the front surface ($n^-$ epitaxial layer 2). In addition, a p epitaxial layer 4 is deposited on the front surface of the epitaxial substrate so as to extend from a portion of the $n^-$ epitaxial layer 2, which is interposed between adjacent p base regions 3, to the p base region 3.

An $n^{++}$ source region 5, a $p^+$ contact region 6, and an n inversion region 7 are selectively provided in the p epitaxial layer 4. The $n^{++}$ source region 5 and the $p^+$ contact region 6 are arranged in a portion of the p epitaxial layer 4 which faces the p base region 3, pass through the p epitaxial layer 4 in a depth direction, and reach the p base region 3. The n inversion region 7 is provided in a portion of the p epitaxial layer 4 which does not face the p base region 3, passes through the p epitaxial layer 4 in the depth direction, and reaches a portion of the $n^-$ epitaxial layer 2 which is interposed between adjacent p base regions 3. In addition, the n inversion region 7 is arranged on the side of the $n^{++}$ source region 5 which is opposite to the $p^+$ contact region 6 so as to be separated from the $n^{++}$ source region 5.

A gate electrode 9 is provided on the surface of a portion of the p epitaxial layer 4, which is interposed between the $n^{++}$ source region 5 and the n inversion region 7, with a gate insulating film 8 interposed therebetween, so as to extend to the surface of the n inversion region 7. The gate insulating film 8 is made of, for example, silicon dioxide ($SiO_2$) or nitrous oxide ($N_2O$). The gate electrode 9 is made of, for example, polysilicon (poly-Si). As such, a MOS gate structure including the p base region 3, the p epitaxial layer 4, the $n^{++}$ source region 5, the $p^+$ contact region 6, the n inversion region 7, the gate insulating film 8, and the gate electrode 9 is provided on the front surface side of the epitaxial substrate. The gate electrode 9 is covered with an interlayer insulating film 10 such as a PSG film. The interlayer insulating film 10 has a source contact hole through which the $n^{++}$ source region 5 and the $p^+$ contact region 6 are selectively exposed.

A titanium nitride (TiN) film 11 is provided on the surface of the interlayer insulating film 10. The end of the TiN film 11 extends onto the surface of the $n^{++}$ source region 5 which is exposed through the source contact hole of the interlayer insulating film 10. A nickel (Ni) film 12 is provided on the surface of the $n^{++}$ source region 5 and the $p^+$ contact region 6 which are exposed through the source contact hole of the interlayer insulating film 10. The end of the Ni film 12 extends onto the surface of a portion of the TiN film 11 which is covered with the interlayer insulating film 10. A front surface electrode 13, which is a source electrode, is provided on the surface of the TiN film 11 and the Ni film 12 so as to cover the entire front surface of the epitaxial substrate in an active region. The active region is a region which a current flows when the semiconductor device is in an on state.

The front surface electrode 13 is provided so as to be buried in the source contact hole of the interlayer insulating film 10 and is electrically connected to the $n^{++}$ source region 5 and the $p^+$ contact region 6 through the Ni film 12. In the active region, a gate pad (not illustrated) is selectively provided on the front surface of the epitaxial substrate and the front surface electrode 13 is arranged so as to be separated from the gate pad and to substantially cover a portion of the front surface of the epitaxial substrate other than the gate pad in the active region. The front surface electrode 13 is made of, for example, aluminum (Al) or an Al alloy, such as aluminum (Al-1% Si) including 1% of silicon or aluminum (Al-0.5% Cu) including 0.5% of copper (Cu).

A first metal film (covering film) 21 is formed in 10% or more of an entire area of the surface of the front surface electrode 13. That is, the first metal film 21 covers 10% or more of the surface area (hereinafter, simply referred to as a surface area) Si of the surface of the front surface electrode 13 opposite to the SiC substrate. Therefore, it is possible to suppress a reduction in a gate threshold voltage Vth and maintain a state (hereinafter, referred to as a normally-off state) in which the source and the drain are not connected to each other when a positive voltage is applied to the gate electrode 9. As the ratio of the surface area (that is, the contact area of the first metal film 21 with the front surface electrode 13) S2 of the first metal film 21 to the surface area Si of the front surface electrode 13 (=S2/S1; hereinafter, referred to as the area ratio of the first metal film 21) increases, the effect of suppressing a reduction in the gate threshold voltage Vth is improved, which is preferable.

Specifically, the area ratio of the first metal film 21 is preferably, for example, equal to or greater than 60% and equal to or less than 90%. When the area ratio of the first metal film 21 is equal to or greater than 60%, it is possible to obtain a semiconductor device having the performance in the allowable range in which the semiconductor device does not have any functional problem as a product. When the area ratio of the first metal film 21 is greater than 90%, there is a concern that the first metal film 21 will come into contact with the gate pad. However, when the area ratio of the first metal film 21 is equal to or less than 90%, the first metal film 21 does not come into contact with the gate pad. Therefore, it is possible to prevent a short circuit between the gate pad and the front surface electrode 13 through the first metal film 21.

The first metal film 21 may be a metal plated film which is formed by an electrolytic plating process or an electroless plating process or a metal film which is formed by a sputtering method or a vapor deposition method. Specifically, the first metal film 21 may be, for example, a Ni film, a Ni alloy (for example, nickel-phosphorous (NiP) or a nickel-boron (NiB)) film, a Cu film, a palladium (Pd) film, a titanium (Ti) film, a platinum (Pt) film, a gold (Au) film, or a silver (Ag) film, or a metal laminated film of two or more of the metal films.

Preferably, the first metal film 21 is a Ni film, a Ni alloy film, a Cu film, or a Ti film, or a metal laminated film of two or more of the metal films. For example, the reason is as follows. When the semiconductor device is mounted in a package, for example, a lead frame (not illustrated) having copper as a base material is soldered to the first metal film 21. In this case, the first metal film 21 seeps into the molten solder (solder leaching) and the thickness of the first metal film 21 increases or the solder comes into contact with the front surface electrode 13. As a result, there is a concern that the adhesion of the first metal film 21 to the lead frame having copper as a base material will be reduced. For this reason, it is preferable to set the thickness of the first metal film 21 to a large value of about 2 μm or more, considering the occurrence of solder leaching. When the first metal film 21 with a large thickness is formed in this way, it is possible to form the first metal film 21 in a short time or at a low cost. A second metal film 22, such as a gold (Au) film, may be formed on the surface of the first metal film 21.

A portion of the front surface of the epitaxial substrate other than the gate pad and the first metal film 21 (the second metal film 22 when the second metal film 22 is provided), specifically, a region between the gate pad and the first metal film 21 or a breakdown voltage structure portion (not illustrated) are protected by a passivation film such as a polyimide film. The breakdown voltage structure portion is a region which is provided around the active region, reduces the electric field of the active region, and holds a breakdown voltage. A contact metal film 14 obtained by sequentially laminating, for example, a Ni film and a Ti film is provided on the rear surface of the epitaxial substrate, that is, the rear surface of the SiC substrate 1 and an ohmic contact is formed between the contact metal film 14 and the SiC substrate 1 which will be an n drain region. A rear surface electrode 15 obtained by sequentially laminating, for example, a Ti film, a Ni film, and an Au film is provided on the surface of the contact metal film 14.

Figure 2:
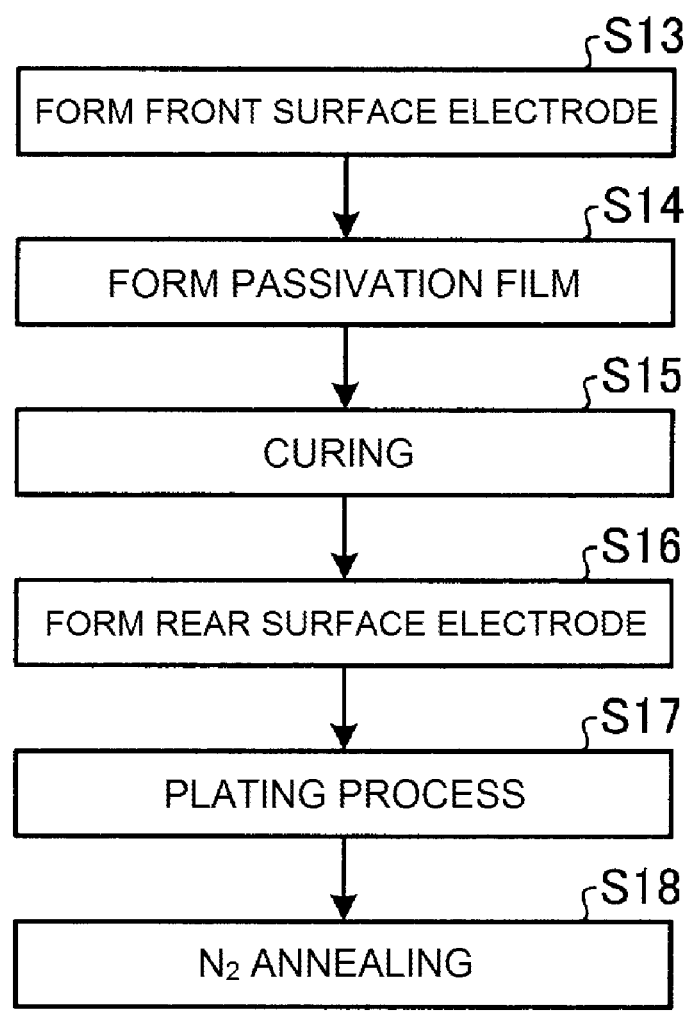
FIG. 2 is a flowchart illustrating the outline of a semiconductor device manufacturing method according to Embodiment 1.

Next, an example in which the first metal film 21 is formed by a plating process in a semiconductor device manufacturing method according to Embodiment 1 will be described. FIG. 2 is a flowchart illustrating the outline of the semiconductor device manufacturing method according to Embodiment 1.

First, in the MOS gate structure or the SiC-MOSFET in which the films from the interlayer insulating film 10 to the contact metal film 14 are formed, an Al layer is patterned in a predetermined shape by photolithography to form the front surface electrode 13 and the gate pad (Step S13). Then, the passivation film (not illustrated), such as a polyimide film, is deposited (formed) on the front surface of the epitaxial substrate (Step S14). A source pad contact hole through which the surface of the front surface electrode 13 is selectively exposed and a gate pad contact hole through which the gate pad is exposed are formed. For example, the surface area S1 of the front surface electrode 13 corresponding to the area ratio of the first metal film 21 (the ratio (=S2/S1) of the surface area S2 of the first metal film 21 to the surface area S1 of the front surface electrode 13) which is formed in the subsequent process is exposed through the source pad contact hole. Then, a heat treatment (curing) for improving the strength of the passivation film is performed at a temperature of, for example, 350° C. for 1 hour (Step S15).

Then, a Ti film, a Ni film, and an Au film are sequentially formed on the surface of the contact metal film 14 by, for example, a sputtering method or a vapor deposition method to form the rear surface electrode 15 (Step S16). Then, for example, a Ni plated film is formed as the first metal film 21 on the surface of a portion of the front surface electrode 13, which is exposed through the source pad contact hole of the passivation film, by an electroless plating process (Step S17). When the first metal film 21 is formed by the electroless plating process, plating pretreatment may be performed by a general method between Step S16 and Step S17 to improve the adhesion between the front surface electrode 13 and the first metal film 21. A process for forming the first metal film 21 is not limited to the electroless plating process and the first metal film 21 may be formed by an electrolytic plating process, a sputtering method, or a vapor deposition method. The source pad contact hole of the passivation film may be formed before Step S17.

Then, annealing is performed in, for example, a nitrogen ($N_2$) gas atmosphere, a mixed gas atmosphere (for example, of $N_2$ gas and argon (Ar) gas) including $N_2$, a vacuum atmosphere or an Ar gas atmosphere (Step S18). Therefore, it is possible to suppress a reduction in the gate threshold voltage Vth when a negative voltage is applied to the gate electrode 9. The annealing temperature in Step S18 may be so low that the structure of the first metal film 21 is not changed. For example, the annealing temperature may be equal to or higher than 150° C. and equal to or lower than 450° C. The annealing temperature in Step S18 varies depending on BT test conditions and is preferably equal to or higher than 300° C. and equal to or lower than 420° C. The annealing time in Step S18 may be, for example, equal to or longer than 0.5 hours and equal to or shorter than 6 hours. The annealing time in Step S18 varies depending on the BT test conditions and is preferably equal to or longer than 1 hour and equal to or shorter than 3 hours. When the annealing temperature and the annealing time are set in the above-mentioned ranges, it is possible to improve the effect of suppressing a reduction in the gate threshold voltage Vth. The SiC-MOSFET illustrated in FIG. 1 is completed by the above-mentioned processes.

The process in Steps S17 and S18 is performed on a general SiC chip having the structure which is formed by the process in Steps S13 to S16. In the general SiC chip, the exposure area of a portion of the front surface electrode 13 which is exposed through the source pad contact hole of the passivation film is about 46% of the surface area S1 of the front surface electrode 13. Therefore, the opening width of the source pad contact hole is adjusted to increase or decrease the exposure area of the front surface electrode 13 before Step S17, in order to obtain the desired area ratio of the first metal film 21. Specifically, an insulating film may be selectively provided on the front surface electrode 13 to decrease the exposure area of the front surface electrode 13, or the passivation film may be patterned to increase the opening width of the source pad contact hole, thereby increasing the exposure area of the front surface electrode 13.

Example 1

Figure 3:
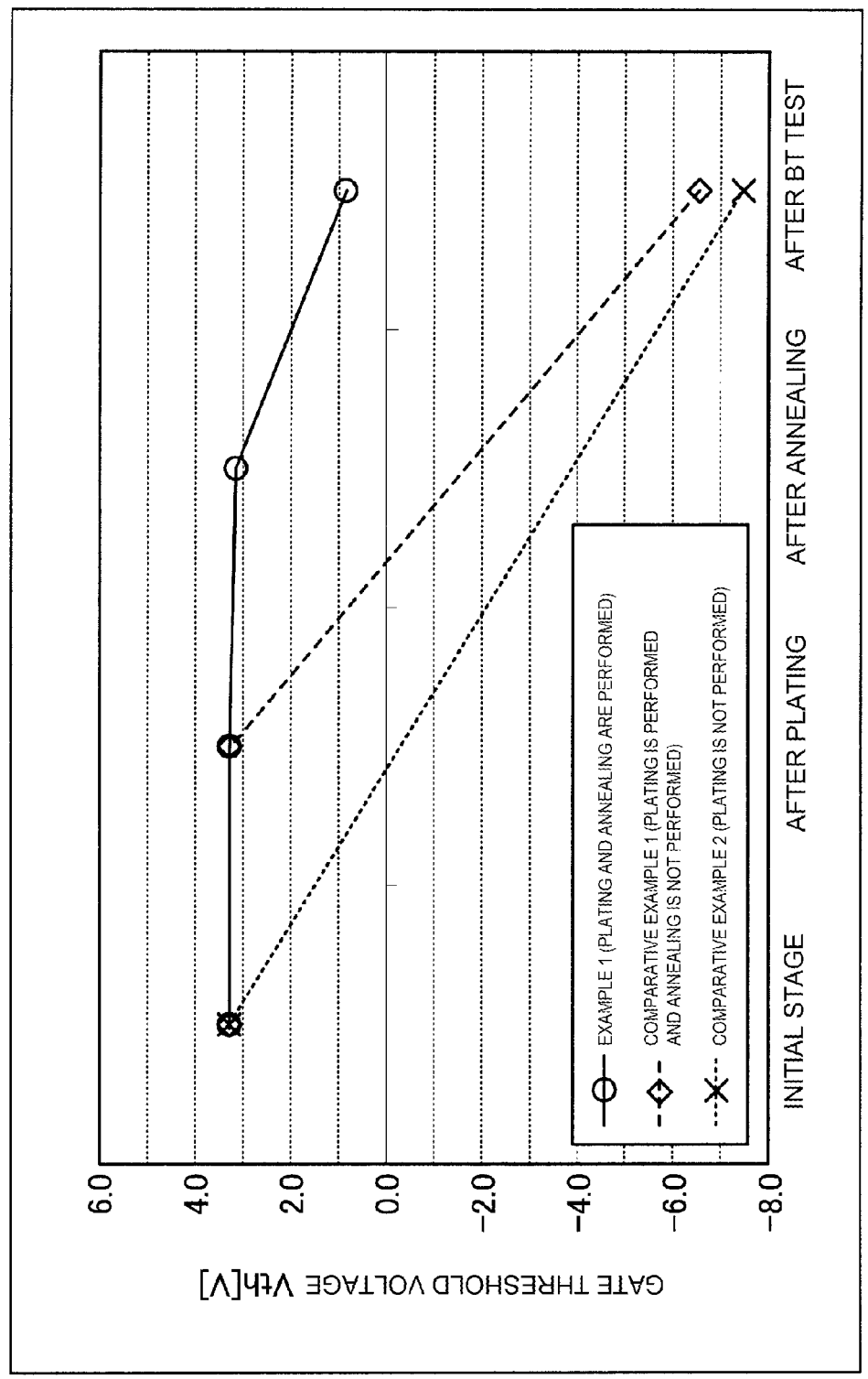
FIG. 3 is a characteristic diagram illustrating a gate threshold voltage of the semiconductor device according to Example 1.

Next, the gate threshold voltage Vth of a semiconductor device according to Example 1 will be described. FIG. 3 is a characteristic diagram illustrating the gate threshold voltage of the semiconductor device according to Example 1. A SiC-MOM-ET was manufactured by the semiconductor device manufacturing method according to Embodiment 1 (hereinafter, referred to as Example 1). In Example 1, a NiP plated film is formed as the first metal film 21 by an electroless NiP plating process in Step S17 and annealing is performed in a $N_2$ atmosphere in Step S18 (plating and annealing are performed). The area ratio (=S2/S1) of the first metal film 21 was 46%.

As a comparative example, a SiC-MOSFET was manufactured, without performing annealing after a first metal film was formed (hereinafter, referred to as Comparative Example 1). In Comparative Example 1, Steps S13 to S17 of the semiconductor device manufacturing method according to Embodiment 1 are performed, similarly to Example 1, and Step S18 is not performed (plating is performed and annealing is not performed). In addition, a SiC-MOSFET without a first metal film was manufactured (hereinafter, referred to as Comparative Example 2). In Comparative Example 2, Steps S13 to S16 of the semiconductor device manufacturing method according to Embodiment 1 are performed and Steps S17 and S18 are not performed (plating and annealing are not performed).

In Example 1 and Comparative Examples 1 and 2, after a negative voltage was applied to the gate electrode, the gate threshold voltage Vth was measured by a bias temperature stress test (BT test). The measurement results are illustrated in FIG. 3. The BT test was performed under the following conditions: a bias temperature (hereinafter, referred to as a BT temperature) was 200° C.; a voltage of −20 V was applied to the gate electrode; and a processing time of 10 minutes. The gate threshold voltage Vth was measured under the following conditions: a room temperature; a drain current Id of 25 mA; and a voltage Vds of 10 V between the drain and the source. FIG. 3 illustrates the gate threshold voltage Vth before the first metal film is formed in Example 1 and Comparative Example 1 (that is, the state in Comparative Example 2; hereinafter, referred to as an initial state), the gate threshold voltage Vth after the first metal film is formed in Example 1 and Comparative Example 1 (hereinafter, referred to as "after plating"), and the gate threshold voltage Vth after annealing in Example 1 and after the negative voltage is applied to the gate electrode (after the BT test) in Example 1 and Comparative Examples 1 and 2.

The results illustrated in FIG. 3 proved that, in Comparative Examples 1 and 2, after the negative voltage was applied to the gate electrode, the gate threshold voltage Vth was greatly reduced to −4 V or less and the semiconductor device was in the normally-on state. In contrast, the results proved that, in Example 1, after the negative voltage was applied to the gate electrode, the reduction in the gate threshold voltage Vth was less than that in Comparative Examples 1 and 2 and the normally-off state was maintained. Therefore, the results proved that, when Steps S17 and S18 were performed as in Example 1, it was possible to suppress the reduction in the gate threshold voltage Vth after the negative voltage was applied. Although not illustrated in the drawings, the inventors found that, when Steps S17 and S18 were performed in the SiC-MOSFET according to the related art, the same effect as described above was obtained.

Example 2

Figure 4:
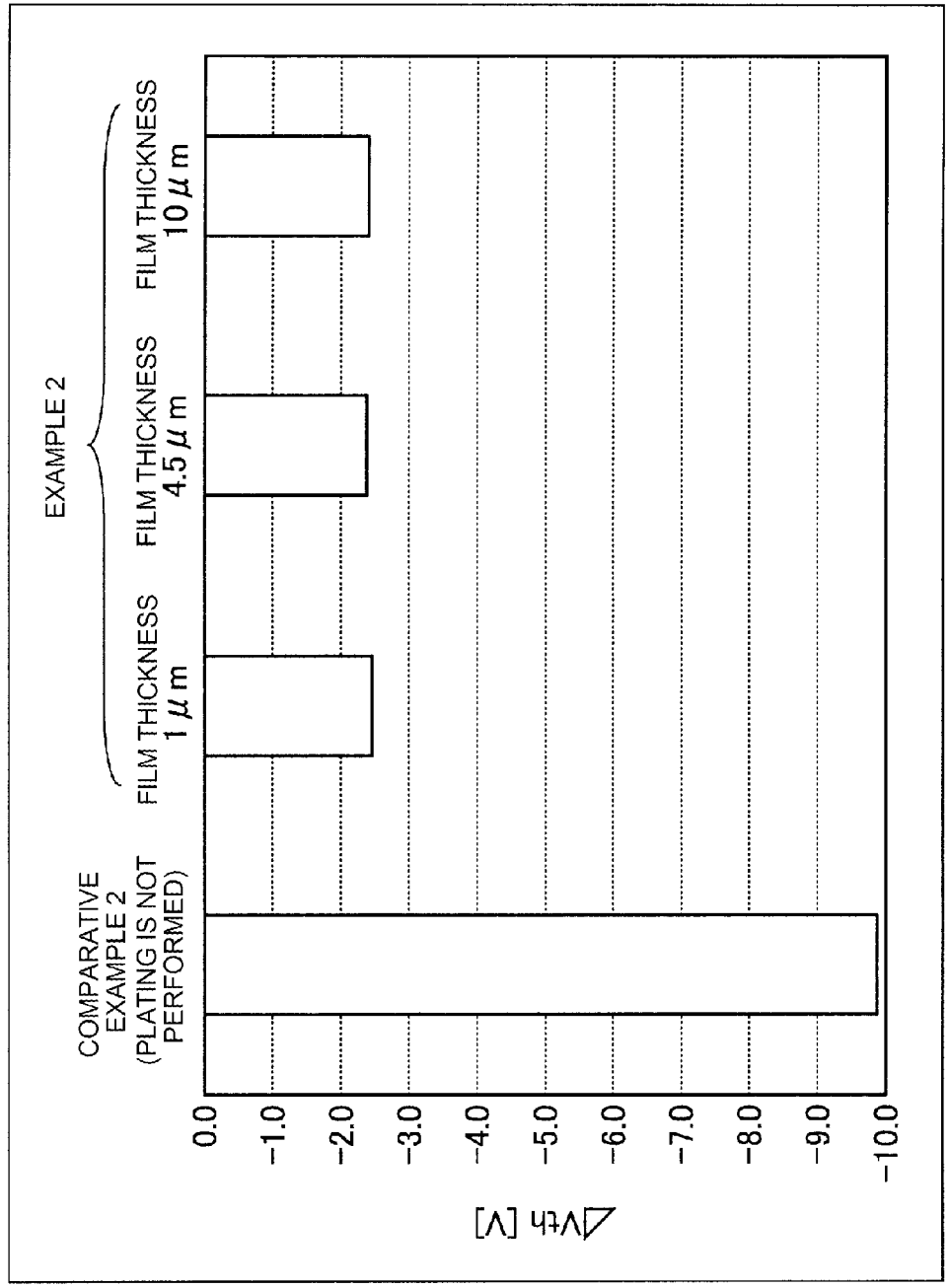
FIG. 4 is a characteristic diagram illustrating the relationship between the thickness of a first metal film and a decrease in gate threshold voltage in a semiconductor device according to Example 2.

Next, the relationship between the thickness of a first metal film 21 and a decrease ΔVth in the gate threshold voltage. FIG. 4 is a characteristic diagram illustrating the relationship between the thickness of a first metal film and a decrease in the gate threshold voltage in a semiconductor device according to Example 2. A plurality of SiC-MOSFETs having first metal films 21 with different thicknesses were manufactured by the semiconductor device manufacturing method according to Embodiment 1 (hereinafter, referred to as Example 2). Specifically, as Example 2, three samples having first metal films 21 with thicknesses of 1 μm, 4.5 μm, and 10 μm were prepared. Example 2 is the same as Example 1 except for the thickness of the first metal film 21.

In Example 2, a difference (hereinafter, referred to as a decrease in the gate threshold voltage) ΔVth between the gate threshold voltage Vth before the BT test (before the negative voltage was applied to the gate electrode) and the gate threshold voltage Vth after the BT test (after the negative voltage was applied to the gate electrode was calculated. The calculation result is illustrated in FIG. 4. The BT test conditions and the measurement conditions of the gate threshold voltage Vth are the same as those in Example 1. FIG. 4 illustrates a decrease ΔVth in the gate threshold voltage in Comparative Example 2 (plating and annealing were not performed) for comparison.

The results illustrated in FIG. 4 proved that, in Example 2, the decrease ΔVth in the gate threshold voltage was substantially constant, regardless of the thickness of the first metal film 21 and was less than the decrease ΔVth in the gate threshold voltage in Comparative Example 2. Therefore, the results proved that a variation (reduction) in the gate threshold voltage Vth of the semiconductor device according to the invention did not depend on the thickness of the first metal film 21.

Example 3

Figure 6:
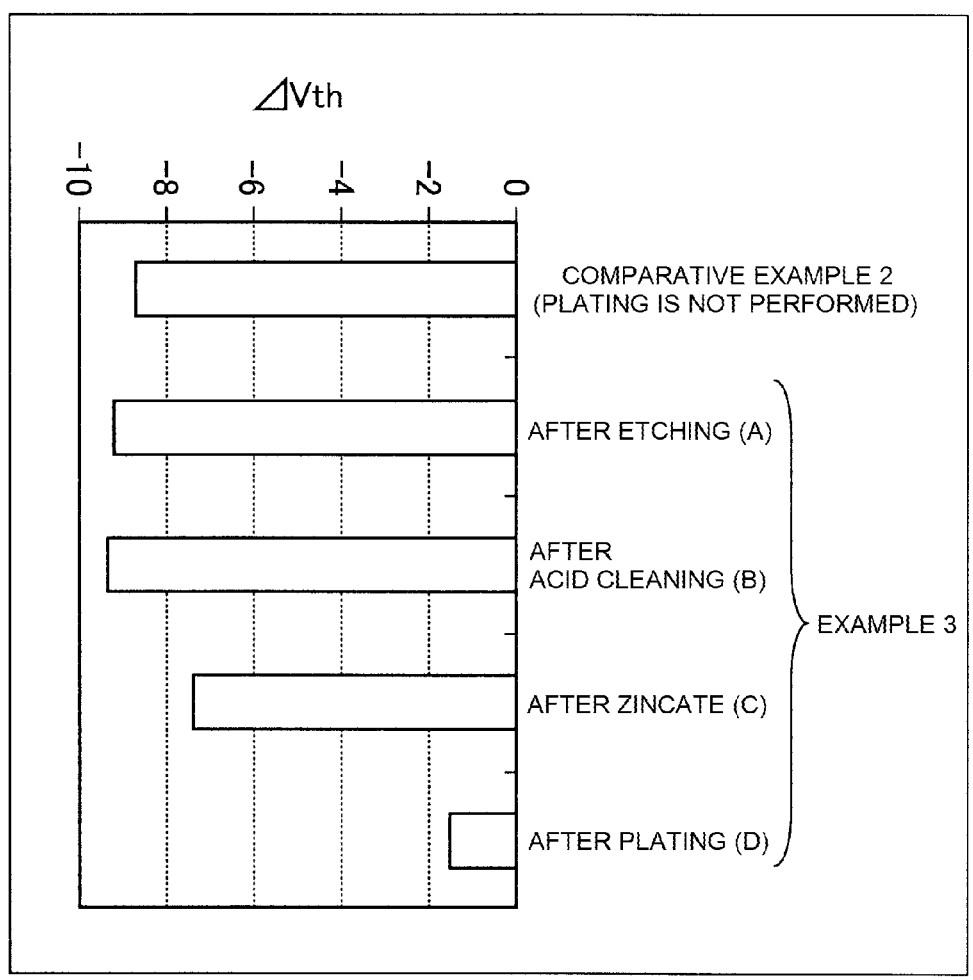
FIG. 6 is a characteristic diagram illustrating the relationship between plating pretreatment for a first metal film and a decrease in gate threshold voltage in a semiconductor device according to Example 3.

Next, the relationship between plating pretreatment and a decrease ΔVth in the gate threshold voltage will be described. FIG. 5 is a table illustrating the conditions of an electroless NiP plating process according to Example 3. FIG. 6 is a characteristic diagram illustrating the relationship between plating pretreatment and a decrease in the gate threshold voltage in a first metal film of a semiconductor device according to Example 3. A plurality of SiC-MOSFETs were manufactured by the semiconductor device manufacturing method according to Embodiment 1 in which a portion of the plating pretreatment process was omitted (hereinafter, referred to as Example 3). Specifically, as Example 3, three samples were prepared by a method in which, after plating pretreatment ended at different times, Step S17 was not performed and Step S18 was performed.

The time when the plating pretreatment ends will be described in detail when the electroless NiP plating process including the plating pretreatment is described. First, Steps S13 to S16 were performed, similarly to Example 1. Then, a defatting process was performed at a temperature of 50° C. for 5 minutes to remove fatty contaminants or foreign materials attached to the surface of the front surface electrode 13 and the front surface electrode 13 was cleaned. Then, an etching process was performed with an acid solution at room temperature (RT: for example, 20° C.) for 2.5 minutes to remove a natural oxide film on the surface of the front surface electrode 13. In the first sample, the plating pretreatment ended in this stage (which is represented by an arrow A in FIG. 5 and is represented by "after etching (A)" in FIG. 6) and annealing was performed in Step S18. In this way, all processes ended.

Then, acid cleaning (desmutting process) was performed with a nitric acid (HNO$_3$) solution at room temperature for 40 seconds to remove smuts generated by the etching process. In the second sample, the plating pretreatment ended in this stage (which is represented by an arrow B in FIG. 5 and is represented by "after acid cleaning (B)" in FIG. 6) and annealing was performed in Step S18. In this way, all processes ended. Then, a zincate treatment was performed at room temperature for 40 seconds to substitute Al in the surface of the front surface electrode 13 for zinc (Zn), thereby forming a Zn film with a desired gain size on the surface of the front surface electrode 13. In the third sample, all of the plating pretreatments up to this stage (which is represented by an arrow C in FIG. 5 and is represented by "after zincate treatment (C)" in FIG. 6) were performed and annealing was performed in Step S18. In this way, all processes end.

Then, an electroless NiP plating process was performed at a temperature of 80° C. for 27 minutes (Step S17) to substitute the Zn film for Ni and Ni was continuously deposited on the surface of the front surface electrode 13, thereby forming a NiP plated film as the first metal film 21. Then, the second metal film 22 was formed on the surface of the first metal film 21 by an immersion Au plating process. As a comparative example, all of the processes up to this stage (which is represented by an arrow D in FIG. 5 and is represented by "after plating (D)" in FIG. 6) were performed and annealing in Step S18 was performed to manufacture a fourth sample. Then, a decrease ΔVth in the gate threshold voltage was calculated in the four samples. The calculation results are illustrated in FIG. 6. The conditions in Step S18, the BT test conditions, and the measurement conditions of the gate threshold voltage Vth are the same as those in Example 1. FIG. 6 illustrates a decrease ΔVth in the gate threshold voltage in Comparative Example 2 (plating and annealing were not performed).

The results illustrated in FIG. 6 proved that the effect of suppressing a reduction in the gate threshold voltage Vth in the sample after plating (D) was substantially the same as that in Example 1. The results proved that, in the sample after etching (A), the sample after acid cleaning (B), and the sample after zincate treatment (C), the decrease ΔVth in the gate threshold voltage was as large as the decrease ΔVth in the gate threshold voltage in Comparative Example 2 and the same effect as that in the sample after plating (D) was not obtained. Therefore, the results proved that a variation in the gate threshold voltage Vth of the semiconductor device according to the invention did not depend on the plating pretreatment.

Example 4

Figure 8:
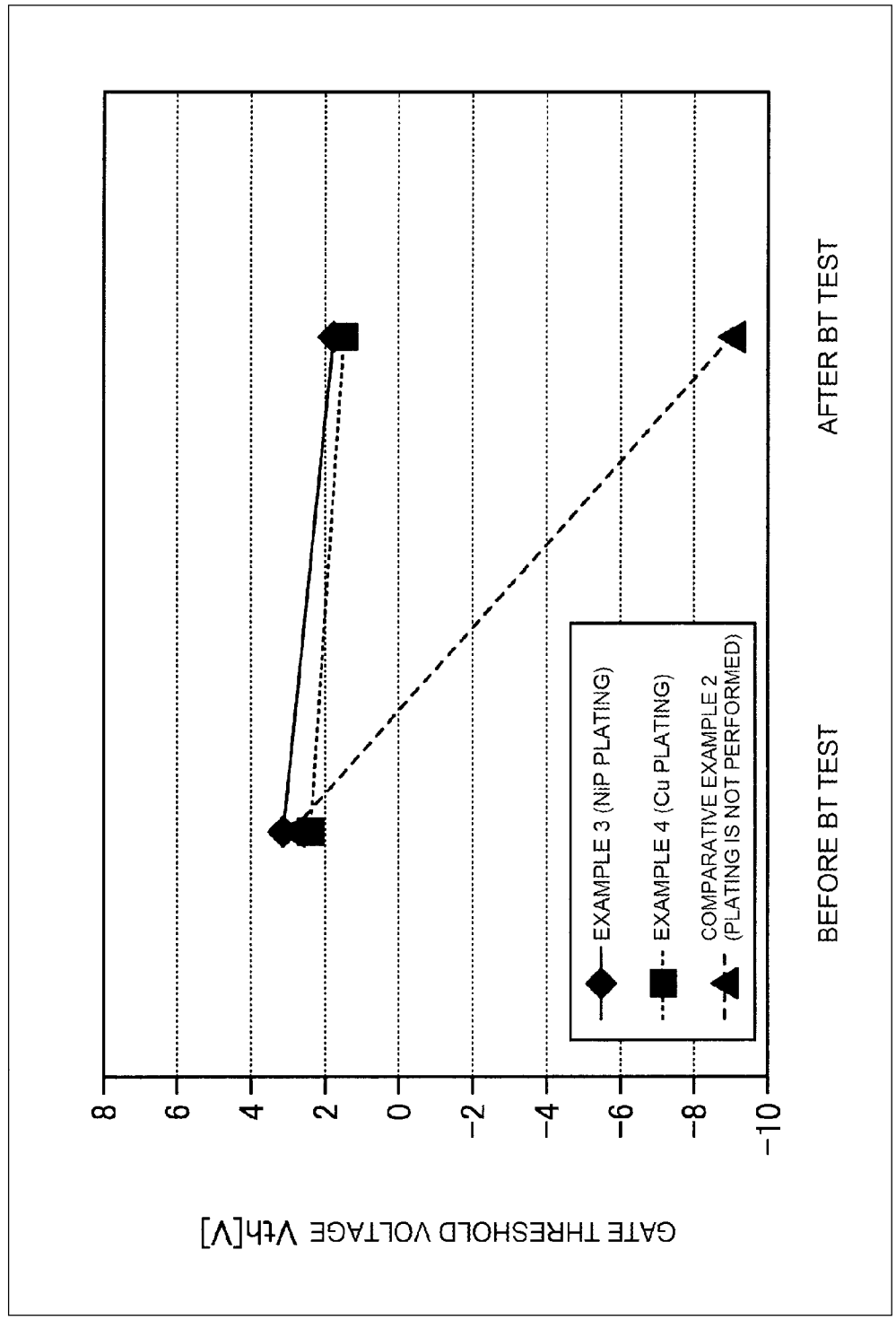
FIG. 8 is a characteristic diagram illustrating the relationship between a material forming a first metal film and a gate threshold voltage in a semiconductor device according to Example 4.

Next, the relationship between the material forming the first metal film 21 and the decrease ΔVth in the gate threshold voltage will be described. FIG. 7 is a table illustrating the conditions of an electroless Cu plating process according to Example 4. FIG. 8 is a characteristic diagram illustrating the material forming the first metal film and the gate threshold voltage in a semiconductor device according to Example 4. A SiC-MOSFET in which a Cu plated film was formed as the first metal film 21 was manufactured by the semiconductor device manufacturing method according to Embodiment 1 (hereinafter, referred to as Example 4).

Specifically, first, the process from Step S13 to Step S16 was performed similarly to Example 1. Then, similarly to Example 3, cleaning, etching, acid cleaning, and a zincate treatment (hereinafter, referred to as a first zincate treatment) were performed as plating pretreatment. In this case, the etching was performed at a temperature of 50° C. for 50 seconds and the acid cleaning was performed at a temperature of 21° C. for 30 seconds. In addition, the acid cleaning was performed again with a nitric acid solution at a temperature of 21° C. for 60 seconds to remove a Zn film formed on the surface of the front surface electrode 13. Then, a second zincate treatment was performed at a temperature of 21° C. for 45 seconds to form a Zn film on the surface of the front surface electrode 13 again.

Then, an electroless Cu plating process was performed at a temperature of 60° C. for 60 minutes (Step S17) to substitute the Zn film for Cu and Cu was continuously deposited on the surface of the front surface electrode 13, thereby forming a Cu plated film as the first metal film 21. Then, annealing was performed in Step S18 to manufacture Example 4. Then, the gate threshold voltage Vth of Example 4 was measured before and after the BT test (before and after the negative voltage was applied to the gate electrode). The measurement results are illustrated in FIG. 8. The conditions of Step S18, the BT test conditions, and the measurement conditions of the gate threshold voltage Vth are the same as those in Example 1. For comparison, FIG. 8 illustrates the gate threshold voltages Vth of Example 3 after plating (D), in which the NiP plated film is formed as the first metal film 21, before and after the BT test and the gate threshold voltages Vth of Comparative Example 2 (plating and annealing are not performed) before and after the BT test.

The results illustrated in FIG. 8 proved that, in Example 4, a decrease ΔVth in the gate threshold voltage was less than that in Comparative Example 2 and the effect of suppressing a reduction in the gate threshold voltage Vth was obtained similarly to Example 3. Therefore, the results proved that a variation in the gate threshold voltage Vth of the semiconductor device according to the invention did not depend on the material forming the first metal film 21.

Example 5

Next, the relationship between the area ratio of a first metal film 21 and a decrease ΔVth in the gate threshold voltage will be described. FIG. 9 is a characteristic diagram illustrating the relationship between the area ratio of the first metal film 21 and a decrease in the gate threshold voltage in the semiconductor devices according to Examples 5 and 9. FIGS. 10A-10D are plan views illustrating arrangements of the first metal film of the semiconductor device according to Example 5. A plurality of SiC-MOSFETs in which the area ratio of the first metal film 21 was equal to or greater than 10% were manufactured by the semiconductor device manufacturing method according to Embodiment 1 (hereinafter, referred to as Example 5). Specifically, as Example 5, samples including the first metal films 21 with area ratios of 10%, 20%, 30%, 46%, 74%, and 90% were prepared.

A method for manufacturing the samples will be described in detail. A plurality of SiC chips having the structure which was formed by the process from Step S13 to Step S16 were prepared. As illustrated in FIG. 10B, in the SiC chip, the exposure area of a portion of a front surface electrode 13 which is exposed through a source pad contact hole 23a of a passivation film 23 is 46% of the surface area S1 of the front surface electrode 13. Reference numeral 24 indicates a gate pad, reference numeral 31 indicates an active region, and reference numeral 32 indicates a breakdown voltage structure portion. Therefore, in each SiC chip, the opening width of the source pad contact hole 23a was changed in order to obtain the above-mentioned area ratio of the first metal film 21.

Figure 10A:
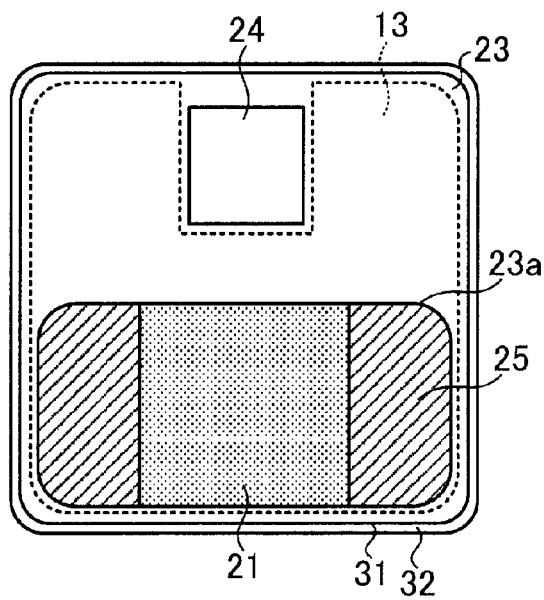
FIGS. 10A, 10B, 10C and 10D are plan views illustrating arrangements of the first metal film in the semiconductor device according to Example 5.
Figure 10B:
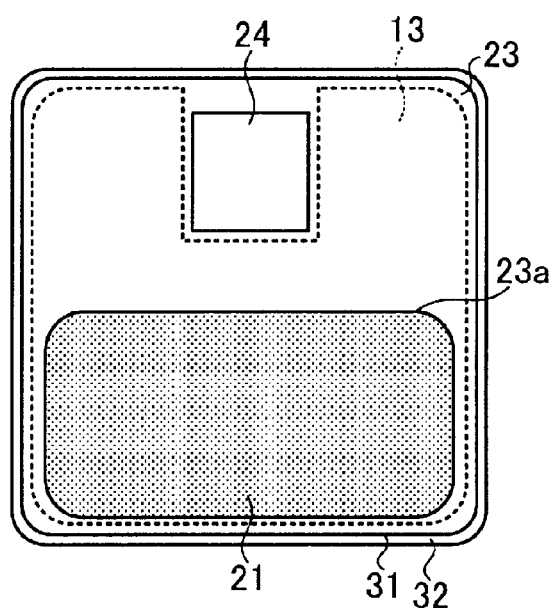
Figure 10C:
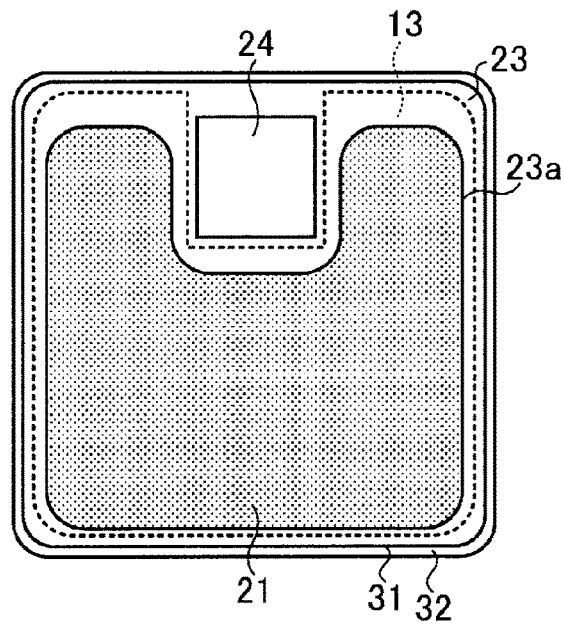
Figure 10D:
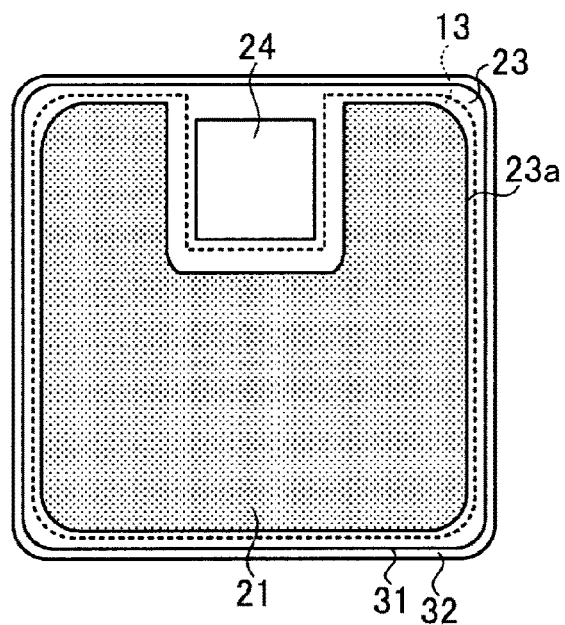

Specifically, for example, as illustrated in FIG. 10A, when the area ratio of the first metal film 21 was less than 46%, for example, when the area ratio was 20%, an insulating film 25 was selectively provided on the portion of the front surface electrode 13, which was exposed through the source pad contact hole 23a, to reduce the exposure area of the front surface electrode 13. As illustrated in FIGS. 10C and 10D, when the area ratio of the first metal film 21 was greater than 46%, for example, when the area ratio was 74% or 90%, the passivation film 23 was patterned to increase the opening width of the source pad contact hole 23a. In Example 5 which was manufactured in this way, a decrease ΔVth in the gate threshold voltage was calculated. The calculation result is illustrated in FIG. 9. The conditions of Steps S17 and S18, the BT test conditions, and the measurement conditions of the gate threshold voltage Vth are the same as those in Example 1. For comparison, FIG. 9 illustrates the decrease ΔVth in the gate threshold voltage in Comparative Example 2 (plating and annealing are not performed) when the area ratio of the first metal film 21 is 0%.

The results illustrated in FIG. 9 proved that the decrease ΔVth in the gate threshold voltage in Example 5 was less than the decrease ΔVth in the gate threshold voltage in Comparative Example 2 and it was possible to reduce the decrease ΔVth in the gate threshold voltage as the area ratio of the first metal film 21 increased. For example, when the area ratio of the first metal film 21 is x and the decrease ΔVth in the gate threshold voltage is y, the relationship between the area ratio of the first metal film 21 and the decrease ΔVth in the gate threshold voltage in Example 5 is represented by the following Expression (1) (a curve represented by reference numeral 41 in FIG. 9).

$$y = 1.25 \cdot \ln(x) - 0.107 \quad [\text{Expression 1}]$$

Example 6

Figure 11:
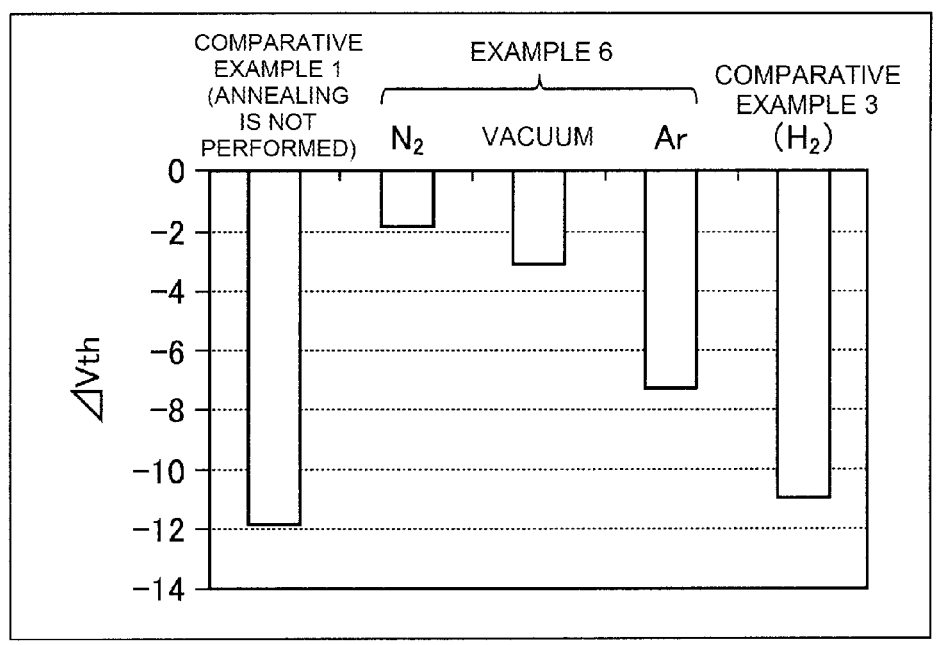
FIG. 11 is a characteristic diagram illustrating the relationship between an annealing atmosphere and a decrease in gate threshold voltage in a semiconductor device according to Example 6.

Next, the relationship between an annealing atmosphere in Step S18 and a decrease ΔVth in the gate threshold voltage will be described. FIG. 11 is a characteristic diagram illustrating the relationship between the annealing atmosphere and a decrease in the gate threshold voltage in a semiconductor device according to Example 6. A plurality of SiC-MOSFETs were manufactured by the semiconductor device manufacturing method according to Embodiment 1 while the annealing atmosphere in Step S18 were changed in various ways (hereinafter, referred to as Example 6). Specifically, as Example 6, three samples which were respectively annealed in a $N_2$ gas atmosphere, a vacuum atmosphere, and an Ar atmosphere in Step S18 were prepared.

The structure of the sample annealed in the $N_2$ gas atmosphere is the same as that in Example 1. The sample annealed in the vacuum atmosphere or the Ar atmosphere has the same structure as that in Example 1 except for the annealing atmosphere in Step S18. Then, the decrease ΔVth in the gate threshold voltage was calculated for each of the samples. The calculation results are illustrated in FIG. 11. For comparison, FIG. 11 illustrates the decrease ΔVth in the gate threshold voltage of the sample annealed in a hydrogen ($H_2$) atmosphere in Step S18 (hereinafter, referred to as Comparative Example 3) and the decrease ΔVth in the gate threshold voltage in Comparative Example 1 (plating is performed and annealing is not performed).

The results illustrated in FIG. 11 proved that the decrease ΔVth in the gate threshold voltage in Comparative Example 3 was as large as the decrease ΔVth in the gate threshold voltage in Comparative Example 1. This proved that the effect of suppressing a reduction in the gate threshold voltage Vth was not obtained in the $H_2$ atmosphere. In contrast, the results proved that the decrease ΔVth in the gate threshold voltage in Example 6 was less than the decrease ΔVth in the gate threshold voltage in Comparative Example 1. This proved that the effect of suppressing a reduction in the gate threshold voltage Vth was obtained in the $N_2$ gas atmosphere, the vacuum atmosphere, and the Ar atmosphere.

The results proved that the sample annealed in the $N_2$ gas atmosphere had the minimum decrease ΔVth in the gate threshold voltage. Therefore, it is preferable to perform annealing in the $N_2$ gas atmosphere or a mixed gas atmosphere including $N_2$ in Step S18. The decrease ΔVth in the gate threshold voltage in the sample annealed in the vacuum atmosphere or the Ar gas atmosphere was more than the decrease ΔVth in the gate threshold voltage in the sample annealed in the $N_2$ gas atmosphere. However, annealing in the vacuum atmosphere makes it possible to reduce the amount of impurities in a furnace and to improve productivity, as compared to annealing in the Ar gas atmosphere. Therefore, the annealing in Step S18 may be performed in the vacuum atmosphere or the Ar gas atmosphere.

Example 7

Next, the relationship between the annealing temperature and annealing time in Step S18 and a decrease ΔVth in the gate threshold voltage will be described. FIG. 12 is a characteristic diagram illustrating the annealing temperature and annealing time and a decrease in the gate threshold voltage in a semiconductor device according to Example 7-1. FIG. 13 is a characteristic diagram illustrating the annealing temperature and annealing time and a decrease in the gate threshold voltage in a semiconductor device according to Example 7-2. A plurality of SiC-MOSFETs were manufactured by the semiconductor device manufacturing method according to Embodiment 1 while the annealing temperature and annealing time in Step S18 were changed in various ways (hereinafter, referred to as Example 7).

Specifically, as Example 7-1, a plurality of samples which were manufactured at an annealing temperature of 280° C. to 450° C. for an annealing time of 0.5 hours to 6 hours in Step S18 were prepared and the decrease ΔVth in the gate threshold voltage was calculated for each sample. The BT test conditions in Example 7-1 are the same as those in Example 1. The calculation results are illustrated in FIG. 12. In addition, as Example 7-2, a plurality of samples which were manufactured at an annealing temperature of 280° C. to 330° C. for an annealing time of 0.5 hours to 6 hours in Step S18 were prepared and the decrease ΔVth in the gate threshold voltage was calculated for each sample. The BT test in Example 7-2 was performed under the following conditions: a BT temperature of 150° C.; a voltage of −10 V was applied to a gate electrode; and a processing time of 10 minutes. The calculation results are illustrated in FIG. 13.

In empty fields in FIGS. 12 and 13, the decrease ΔVth in the gate threshold voltage is not calculated since it is clear that the decrease ΔVth in the gate threshold voltage, which is substantially equal to that in other combinations of the annealing temperature and the annealing time in FIGS. 12 and 13, is obtained on the basis of the decrease ΔVth in the gate threshold voltage in the different combinations of the annealing temperature and the annealing time. Examples 7-1 and 7-2 have the same structure as Example 1 except for the annealing temperature and annealing time in Step S18.

The results illustrated in FIGS. 12 and 13 proved that, when the annealing temperature was equal to or higher than 150° C. and equal to or lower than 450° C. and the annealing time was equal to or longer than 0.5 hours and equal to or shorter than 6 hours, it was possible to suppress a reduction in the gate threshold voltage Vth, as compared to the related art. Preferably, the decrease ΔVth in the gate threshold voltage is less than, for example, a voltage value of −4 V at which the semiconductor device is normally turned on in the results illustrated in FIG. 12. In the results illustrated in FIG. 13, the decrease ΔVth in the gate threshold voltage may be less than, for example, −0.03 V. That is, as represented by a thick frame in FIGS. 12 and 13, it is preferable that the annealing temperature be equal to or higher than 300° C. and equal to or lower than 420° C. and the annealing time be equal to or longer than 1 hour and equal to or shorter than 3 hours. In this case, it is possible to suppress the decrease ΔVth in the gate threshold voltage to such an extent that the normally-off state can be maintained.

As described above, according to Embodiment 1, after the element structure of the MOSFET is formed on the SiC substrate, the first metal film is formed on the front surface electrode and annealing is performed in the $N_2$ atmosphere. Therefore, it is possible to suppress a reduction in the gate threshold voltage when the negative voltage is applied to the gate electrode. As a result, it is possible to maintain the gate threshold voltage to be close to the desired set value and thus to improve the reliability of the semiconductor device. In addition, according to Embodiment 1, it is possible to improve the effect of suppressing the reduction in the gate threshold voltage as the area ratio of the first metal film increases.

According to Embodiment 1, after the element structure of the MOSFET is formed on the SiC substrate, the first metal film is formed on the front surface electrode. Therefore, it is possible to suppress a reduction in the gate threshold voltage. For example, when a SiC chip (SiC substrate) in which the element structure of the MOSFET is formed is acquired and the invention is applied to the SiC chip, it is possible to obtain the effect of suppressing a reduction in the gate threshold voltage.

According to Embodiment 1, the opening width of the source pad contact hole or the surface of the front surface electrode is covered with the insulating film to increase or decrease the exposure area of the front surface electrode, thereby adjusting the area ratio of the first metal film. Therefore, for example, even when a SiC chip in which the element structure of the MOSFET is formed is acquired, it is possible to easily set the area ratio of the first metal film to a desired value.

Embodiment 2

Figure 14:
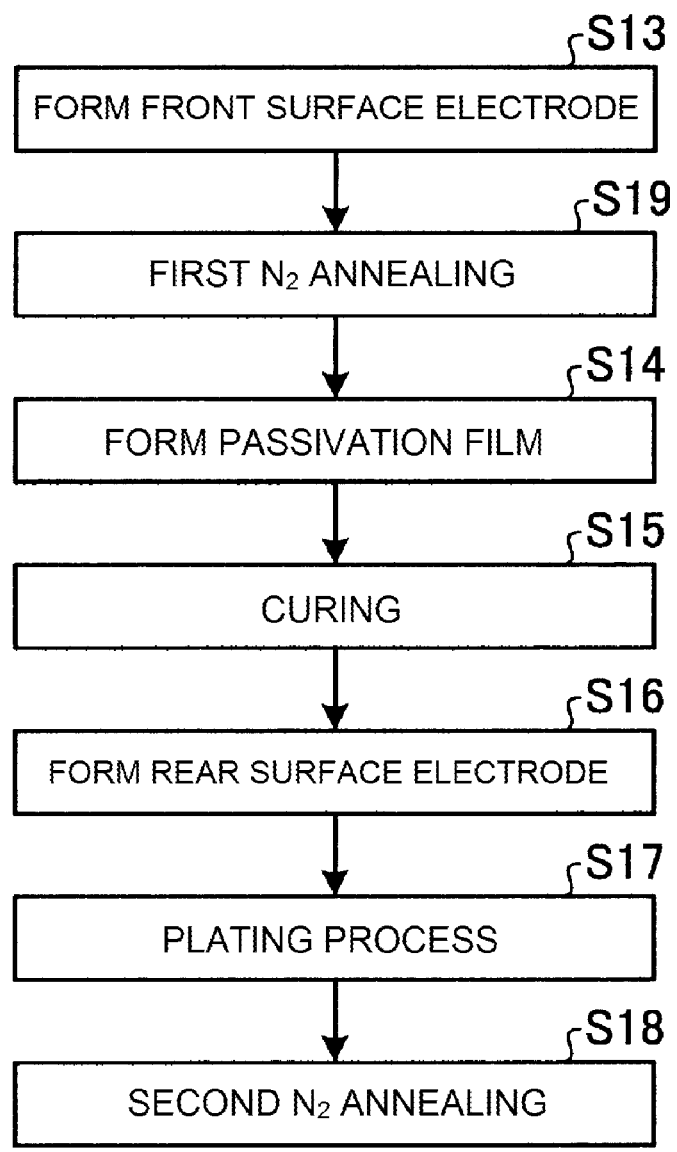
FIG. 14 is a flowchart illustrating the outline of a semiconductor device manufacturing method according to Embodiment 2.

Next, a semiconductor device manufacturing method according to Embodiment 2 will be described. FIG. 14 is a flowchart illustrating the outline of the semiconductor device manufacturing method according to Embodiment 2. The semiconductor device manufacturing method according to Embodiment 2 differs from the semiconductor device manufacturing method according to Embodiment 1 in that a first annealing process is performed (Step S19) after a front surface electrode 13 is formed (Step S13) and before a passivation film is formed (Step S14). The annealing temperature of the first annealing process may be greater than the annealing temperature of the annealing process in Step S18 (hereinafter, referred to as a second annealing process) and may be equal to or greater than, for example, 350° C. The conditions other than the annealing temperature of the first annealing process may be the same as those in the second annealing process.

Example 8

Figure 15:
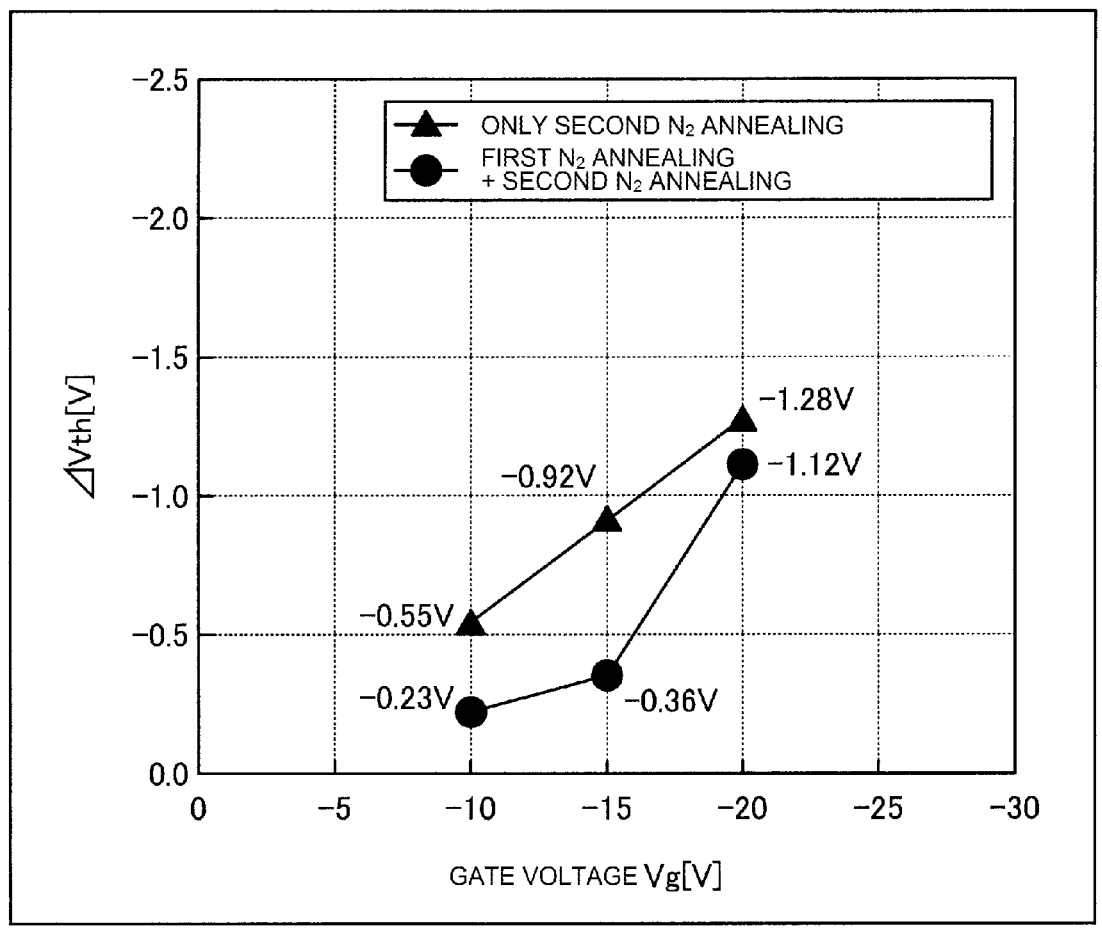
FIG. 15 is a characteristic diagram illustrating a decrease in the gate threshold voltage of a semiconductor device according to Example 8.
Figure 16:
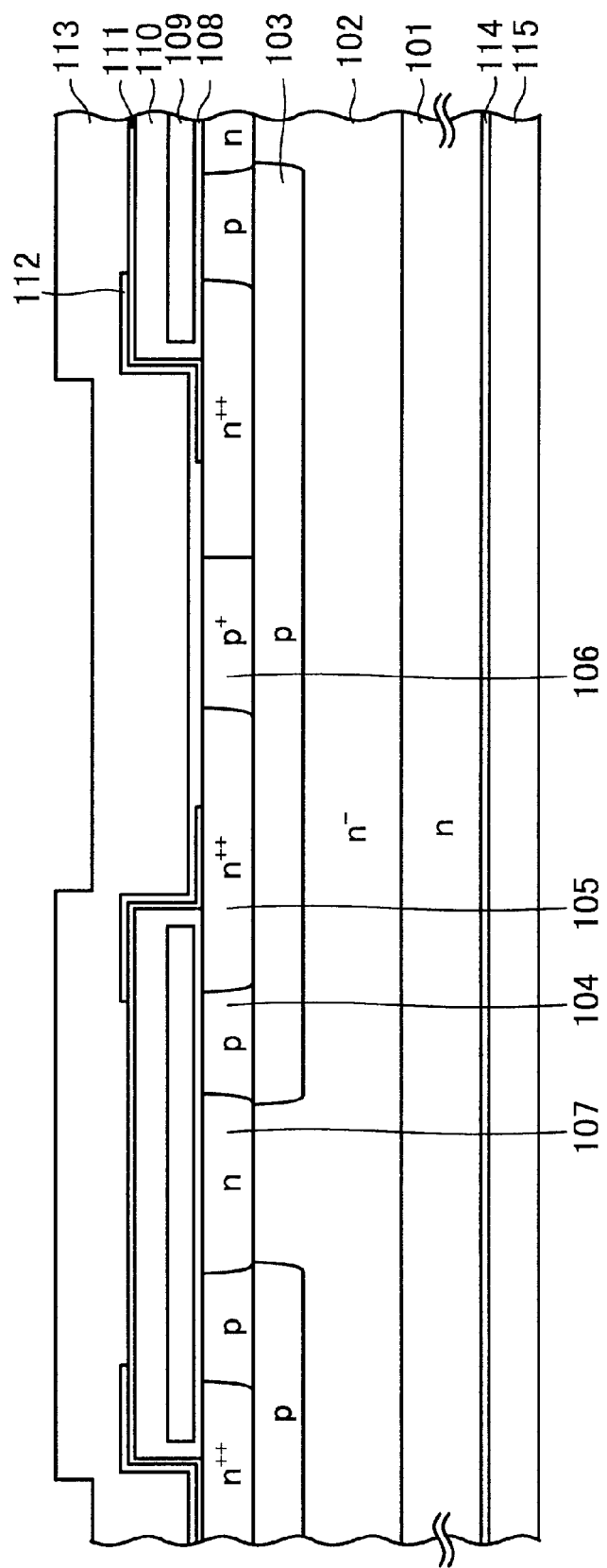
FIG. 16 is a cross-sectional view illustrating the structure of a SiC-MOSFET according to the related art.

Next, a decrease ΔVth in the gate threshold voltage of a semiconductor device according to Example 8 will be described. FIG. 15 is a characteristic diagram illustrating a decrease in the gate threshold voltage of the semiconductor device according to Example 8. A SiC-MOSFET was manufactured by the semiconductor device manufacturing method according to Embodiment 2 (hereinafter, referred to as Example 8). Example 8 is the same as Example 1 except that the first annealing process in Step S19 is performed. That is, in Example 8, the first annealing process is performed after the front surface electrode 13 is formed and the second annealing process is performed after the first metal film 21 is formed.

The decrease ΔVth in the gate threshold voltage was calculated for Example 8. The calculation result is illustrated in FIG. 15. FIG. 15 illustrates the decrease ΔVth in the gate threshold voltage in Example 1 in which only the second annealing process is performed. The results illustrated in FIG. 15 proved that, when both the first annealing process and the second annealing process were performed, it is possible to further reduce the decrease ΔVth in the gate threshold voltage after a negative voltage was applied to a gate electrode.

Example 9

Next, the relationship between the area ratio of a first metal film 21 and a decrease ΔVth in the gate threshold voltage will be described. A plurality of Examples 9-1 and 9-2 in which the area ratio of the first metal film 21 was equal to or greater than 46% were manufactured by the semiconductor device manufacturing method according to Embodiment 2. Specifically, as Examples 9-1 and 9-2, samples including the first metal films 21 with area ratios of 46%, 74%, and 90% were prepared. The first annealing process was performed at a temperature of 350° C. for 1 hour. The second annealing process was performed at a temperature of 300° C. for 3 hours. A method for adjusting the area ratio of the first metal film 21 is the same as that in Example 5.

Then, the decrease ΔVth in the gate threshold voltage was calculated for Examples 9-1 and 9-2. The calculation results are illustrated in FIG. 9. The BT test in Example 9-1 was performed under the following conditions: a BT temperature of 200° C.; and a voltage of −20 V was applied to the gate electrode. The BT test in Example 9-2 was performed under the following conditions: a BT temperature of 175° C.; and a voltage of −10 V was applied to the gate electrode. The measurement conditions of the gate threshold voltage Vth are the same as those in Example 1.

The results illustrated in FIG. 9 proved that, in Examples 9-1 and 9-2, it was possible to reduce the decrease ΔVth in the gate threshold voltage as the area ratio of the first metal film 21 increased, similarly to Example 5. For example, in Example 9-1, when the area ratio of the first metal film 21 is x and the decrease ΔVth in the gate threshold voltage is y, the relationship between the area ratio of the first metal film 21 and the decrease ΔVth in the gate threshold voltage is represented by the following Expression (2) (a curve represented by reference numeral 42 in FIG. 9).

$$y=1.956 \cdot \ln(x)+0.0973 \quad \text{[Expression 2]}$$

In Example 9-2, when the area ratio of the first metal film 21 is x and the decrease ΔVth in the gate threshold voltage is y, the relationship between the area ratio of the first metal film 21 and the decrease ΔVth in the gate threshold voltage is represented by the following Expression (3) (a curve represented by reference numeral 43 in FIG. 9).

$$y=0.8007 \cdot \ln(x)+0.0634 \quad \text{[Expression (3)]}$$

As described above, according to Embodiment 2, it is possible to obtain the same effect as that in Embodiment 1.

The invention is not limited to the above-described embodiments and various modifications and changes of the invention can be made, without departing from the scope and spirit of the invention. For example, in the above-described embodiments, the MOSFET is formed using the SiC substrate which will be the n drain region. However, the MOSFET may be formed using a SiC substrate which will be an n⁻ drift layer. In addition, in the above-described embodiments, the SiC-MOSFET is described as an example. However, the invention is not limited to the above-mentioned embodiments. For example, the invention can be applied to a MOS semiconductor device having a MOS gate structure such as an IGBT.

INDUSTRIAL APPLICABILITY

As described above, the semiconductor device and the semiconductor device manufacturing method according to the invention are useful for a MOS semiconductor device using a SiC semiconductor.

What is claimed is:

1. A semiconductor device, comprising:
an insulated gate structure formed on a front surface of a silicon carbide substrate, the insulated gate structure including a gate insulating film and a gate electrode, the gate electrode being disposed within an active region through which a current flows when the semiconductor device is in an on state;
an interlayer insulating film formed on the gate electrode;
a front surface electrode consisting of aluminum or an aluminum alloy, and having an upper surface and a lower surface opposite to the upper surface, the front surface electrode being formed on the interlayer insulating film so as to be insulated from the gate electrode, the lower surface of the front surface electrode facing the interlayer insulating film, the front surface electrode entirely covering an area in which the gate electrode is disposed in a plan view of the semiconductor device; and
a covering film, including a metal film or a lamination of plural metal films, and being disposed directly on the upper surface of the front surface electrode, the covering film covering in a range of 10% to 90% of the entire upper surface of the front surface electrode in the plan view, the covering film having a thickness equal to or greater than 2 µm.

2. The semiconductor device according to claim 1, wherein the covering film covers 60% to 90% of the entire upper surface of the front surface electrode.

3. The semiconductor device according to claim 1, wherein each metal film of the covering film is made of materials selected from the group of materials consisting of nickel, a nickel alloy, copper, palladium, titanium, platinum, gold, and silver.

4. The semiconductor device according to claim 1, wherein each metal film of the covering film is made of materials selected from the group of materials consisting of nickel, a nickel alloy, copper, palladium, platinum, and silver.

5. The semiconductor device according to claim 1, further comprising a nickel film, wherein
the substrate includes a source region and a contact region that are disposed in the substrate front surface,
the interlayer insulating film has a contact hole exposing the source region and the contact region of the substrate,
the front surface electrode is disposed in the contact hole, and the nickel film is disposed in the contact hole, on the source region and the contact region of the substrate, beneath the front surface electrode.

6. The semiconductor device according to claim 5, further comprising a nickel titanium film disposed on the interlayer insulating film,
wherein the front surface electrode is disposed on the nickel film and the nickel titanium film so as to cover an entire area of the active region.

7. The semiconductor device according to claim 6, wherein an end portion of the nickel film extends to the interlayer insulating film so as to overlap an end portion of the nickel titanium film in the plan view of the semiconductor device.

8. The semiconductor device according to claim 1, wherein the covering film is formed so as to suppress a reduction in a threshold voltage of the gate electrode.

9. The semiconductor device according to claim 1, further comprising a first metal film, wherein
the substrate includes a source region and a contact region that are disposed in the substrate front surface, and
the first metal film is disposed between the contact region of the substrate and the front surface electrode.

10. The semiconductor device according to claim 1, further comprising a first metal film and a second metal film, each containing nickel, wherein
the substrate includes a source region and a contact region that are disposed in the substrate front surface,
the first metal film is disposed in the contact region, and the second metal film is disposed on the interlayer insulating film, and
an end portion of the first metal film extends to the interlayer insulating film so as to overlap an end portion of the second metal film in the plan view of the semiconductor device.

11. The semiconductor device according to claim 10, wherein the first metal film is comprised of nickel, and the second metal film is made of nickel titanium.

12. A semiconductor device comprising:
an insulated gate structure formed on a front surface of a silicon carbide substrate, the insulated gate structure including a gate insulating film and a gate electrode;
an interlayer insulating film formed on the gate electrode;
a front surface electrode consisting of aluminum or an aluminum alloy, and having an upper surface and a lower surface opposite to the upper surface, the front surface electrode being formed on the interlayer insulating film so as to be insulated from the gate electrode, the lower surface of the front surface electrode facing the interlayer insulating film; and
a covering film including a metal film or a lamination of plural metal films, and being disposed directly on the upper surface of the front surface electrode, an upper surface area of the covering film being smaller than an upper surface area of the front surface electrode in a plan view of the semiconductor device, so that the upper surface of the front surface electrode includes a non-covering area in which the covering film is not disposed, an area ratio of the upper surface area of the covering film to that of the front surface electrode being in a range of 10% to 90% in the plan view, the covering film having a thickness equal to or greater than 2 µm.

* * * * *